(12) United States Patent
Lunt et al.

(10) Patent No.: US 9,985,158 B2
(45) Date of Patent: May 29, 2018

(54) VISIBLY TRANSPARENT, LUMINESCENT SOLAR CONCENTRATOR

(75) Inventors: Richard Royal Lunt, Okemos, MI (US); Vladimir Bulovic, Lexington, MA (US); Miles Clark Barr, Cambridge, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 947 days.

(21) Appl. No.: 13/495,379

(22) Filed: Jun. 13, 2012

(65) Prior Publication Data

US 2013/0333755 A1    Dec. 19, 2013

(51) Int. Cl.
*H01L 31/055*    (2014.01)

(52) U.S. Cl.
CPC ............ *H01L 31/055* (2013.01); *Y02E 10/52* (2013.01)

(58) Field of Classification Search
None
See application file for complete search history.

(56) References Cited

U.S. PATENT DOCUMENTS

| | | | | |
|---|---|---|---|---|
| 3,509,712 A * | 5/1970 | Grohoski | ............... | G04C 10/02 136/257 |
| 3,764,574 A * | 10/1973 | Marks | ................... | C08G 77/58 252/301.35 |
| 4,819,039 A * | 4/1989 | Chi | ......................... | C03C 3/064 257/431 |
| 6,670,207 B1 * | 12/2003 | Roberts | ................ | B60Q 1/2665 257/E23.044 |
| 2003/0077846 A1 * | 4/2003 | Zucchelli | ................ | H01L 22/34 438/14 |
| 2006/0260605 A1 * | 11/2006 | Connor | .................... | F24J 2/085 126/561 |
| 2007/0151595 A1 * | 7/2007 | Chiou | .................... | B82Y 20/00 136/255 |
| 2009/0205701 A1 * | 8/2009 | Govaerts | ........... | H01L 31/02322 136/247 |
| 2009/0229652 A1 * | 9/2009 | Mapel | ................... | H01L 31/055 136/246 |
| 2009/0229664 A1 * | 9/2009 | Appadurai | .............. | C03C 17/36 136/261 |

(Continued)

OTHER PUBLICATIONS

Guillaud et al. "Metallophthalocyanines: Gas sensors, resistors and field effect transistors" Coordination Chemistry Reviews 178-180 (1998) 1433-1484.*

(Continued)

*Primary Examiner* — Magali P Slawski
(74) *Attorney, Agent, or Firm* — Kilpatrick Townsend & Stockton LLP

(57) ABSTRACT

A visibly transparent luminescent solar concentrator (LSC) is disclosed. The LSC includes a transparent substrate having at least one edge surface. A dye layer is coupled to the substrate, the dye layer having a peak absorption wavelength outside the visible band, the dye layer being configured to re-emit light at a peak emission wavelength outside the visible band, at least a portion of the re-emitted light being waveguided to the edge surface of the substrate. A photovoltaic device is coupled to the edge surface of the transparent substrate, the photovoltaic device being configured to absorb light at the peak emission wavelength and generate electrical energy.

34 Claims, 11 Drawing Sheets

(56) References Cited

U.S. PATENT DOCUMENTS

| | | | | |
|---|---|---|---|---|
| 2009/0302237 | A1* | 12/2009 | Bortz | C09K 11/02 250/473.1 |
| 2010/0193011 | A1 | 8/2010 | Mapel et al. | |
| 2011/0010911 | A1 | 1/2011 | Baldo et al. | |
| 2011/0253197 | A1 | 10/2011 | Mapel et al. | |
| 2011/0301301 | A1* | 12/2011 | Proto | C08F 8/30 525/330.5 |
| 2015/0162462 | A1* | 6/2015 | Berini | H01L 31/18 257/432 |

OTHER PUBLICATIONS

Torres "Modulating the Electronic Properties of Porphyrinoids" http://www.phthalocyanines.es/research-lines/phthalocyanines-for-photovoltaic-cells/ accessed Jun. 13, 2015 10:48:28 AM.*

The Oxford English Dictionary "transparent, adj. (and n.)." OED Online. Oxford University Press, Sep. 2015. Web. Oct. 8, 2015.*

Oxford English Dictionary "luminophore, n." OED Online. Oxford University Press, Mar. 2016. Web. Mar. 30, 2016.*

Newnes Dictionary of Electronics "Luminophore." Newnes Dictionary of Electronics, Newnes. S.W. Amos and R.S. Amos. Oxford: Elsevier Science & Technology, 1999. Credo Reference. Web. Mar. 30, 2016.*

VPG "Soda Lime Optical Glass Flats from VPG" http://www.vpglass.com/optical_glass/sodalime_glass.html, Accessed Dec. 26, 2016.*

C. L. Mulder, P. D. Reusswig, A. M. Velázquez, H. Kim, C. Rotschild, M. A. Baldo, "Dye alignment in luminescent solar concentrators: I. Vertical alignment for improved waveguide coupling", Optical Society of America, 18, (Apr. 2010).

C. L. Mulder, P. D. Reusswig, A. M. Velázquez, H. Kim, C. Rotschild, M. A. Baldo, "Dye alignment in luminescent solar concentrators: II. Vertical alignment for improved waveguide coupling", Optical Society of America, 18, (Apr. 2010).

Michael J. Currie, Jonathan K. Mapel, Timothy D. Heidel, Shalom Goffri, Marc A. Baldo, "High-Efficiency Organic Solar Concentrators for Photovoltaics", Science, 321, (Jul. 2008).

Omar Moudam, Brenda C. Rowan, Mohammed Alamiry et al., "Europium complexes with high total photoluminescence quantum yields in solution and in PMMA", Chem. Comm., (2009).

Xin Wang, Tongxin Wang, Xiujie Tian, Lijuan Wang et al., "Europium complex doped luminescent solar concentrators with extended absorption range from UV to visible region", Solar Energy, 85, (2011).

Jan Christoph Goldschmidt, Marius Peters, Armin Bosch et al.,"Increasing the efficiency of fluorescent concentrator systems", Solar Energy Materials & Solar Cells, 93, (2009).

L. H. Slooff, E. E. Bende, A. R. Burgers et al., "A luminescent solar concentrator with 7.1% power conversion efficiency", Phys. Stat. Sol., 2, (2008).

Noel C. Giebink, Gary P. Wiederrecht, and Michael R. Wasielewski, "Resonance-shifting to circumvent reabsorption loss in luminescent solar concentrators", Nature Photonics, (2011).

J. S. Batchelder, A. H. Zewail, and T. Cole, "Luminescent solar concentrators. 2: Experimental and theoretical analysis of their possible efficiencies", Applied Optics, 20, (Nov. 1981).

Michael G. Debije and Paul P. C. Verbunt, "Thirty Years of Luminescent Solar Concentrator Research: Solar Energy for the Built Environment", Advanced Energy Materials, (2011).

G. V. Shcherbatyuk, R. H. Inman, C. Wang, R. Winston, and S. Ghosh, "Viability of using near infrared PbS quantum dots as active materials in luminescent solar concentrators", Applied Physics Letters, 96, (2010).

Jana Bomm, Andreas Buchtemann, Amanda J. Chatten, "Fabrication and full characterization of state-of-the-art quantum dot luminescent solar concentrators", Solar Energy Materials & Solar Cells, 95, (2011).

Meredith G. Hyldahl, Sheldon T. Bailey, Bruce P. Wittmershaus, "Photo-stability and performance of CdSe/ZnS quantum dots in luminescent solar concentrators", Solar Energy, 83, (2009).

Renata Reisfeld, Samuel Neuman, "Planar solar energy convertor and concentrator based on uranyl-doped glass", Nature, 274, (Jul. 1978).

Tongxin Wang, Jun Zhang, Wei Ma et al., "Luminescent solar concentrator employing rare earth complex with zero self-absorption loss", Solar Energy, 85, (2011).

* cited by examiner

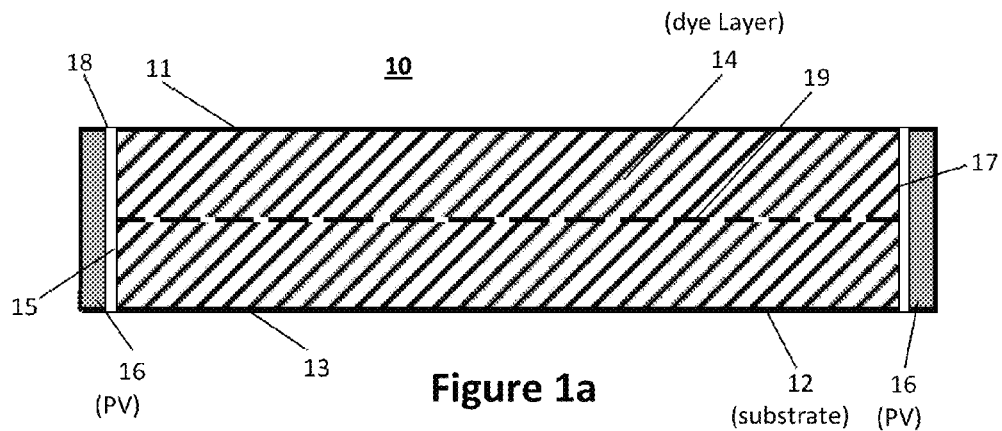
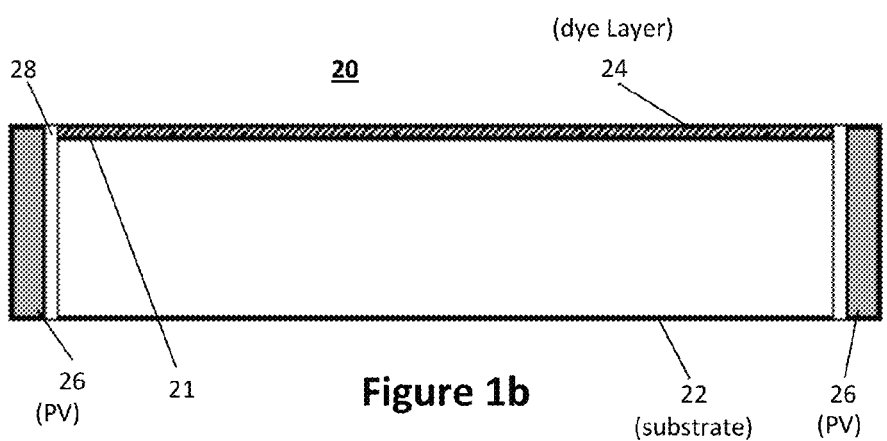

Thin Film Abs. / PL

VISIBLY TRANSPARENT, LUMINESCENT SOLAR CONCENTRATOR

FIELD OF INVENTION

This invention relates to the field of photovoltaic devices and more particularly, organic photovoltaic devices.

BACKGROUND

Manipulation of excitons in organic and molecular semiconductors provides opportunities for unique solar harvesting applications. For example, the presence of strongly-bound excitons leads to large optical resonances, generating structured absorption that can be utilized to produce highly transparent and efficient near-infrared emitting dyes suitable for low-cost luminescent solar concentrators (LSC). The obstacle of large-area solar cell deployment could be overcome, in part, with development of such a transparent photovoltaic system where incorporation of the LSC as window panes enhances the functionality of already utilized transparent surfaces without requiring the acquisition of undeveloped real estate and can significantly reduce balance-of-systems and PV installation costs.

SUMMARY OF THE INVENTION

A visibly transparent luminescent solar concentrator (LSC) is disclosed. The LSC includes a transparent substrate having at least one edge surface. A dye layer is coupled to the substrate, the dye layer having a peak absorption wavelength outside the visible band, the dye layer being configured to re-emit light at a peak emission wavelength outside the visible band, at least a portion of the re-emitted light being waveguided to the edge surface of the substrate. A photovoltaic device is coupled to the edge surface of the transparent substrate, the photovoltaic device being configured to absorb light at the peak emission wavelength and generate electrical energy.

The peak emission wavelength may be selected to optimize internal reflections within the transparent substrate. The transparent substrate may have an index of refraction that is selected to optimize internal reflections within the transparent substrate. The dye layer may have a peak absorption wavelength in at least one of the ultraviolet (UV) and near-infrared (NIR) bands. The dye layer may have a peak absorption of up to 20% of light in the visible band. The dye layer may have a peak absorption of up to 50% of light in the visible band.

The dye layer may include at least one of a molecular dye, an organometallic complex, and a rare earth phosphor. The dye layer may include at least one component selected from the group of a phthalocyanine, a porphyrin, rhodamine, an organic laser dye, perylene and its derivatives, a cyanine, a coumarin, a dioxazine, a naphthalimide, a thiazine and a stilbene. The dye layer may include at least one of U3, SnPc and carbon nanotubes.

The LSC may also include an index matching compound disposed between the edge of the substrate and the photovoltaic device. The photovoltaic device may include at least one of cadmium telluride, cadmium indium gallium selenide, copper indium sulfide, amorphous silicon, monocrystalline silicon, multicrystalline silicon, amorphous silicon/polysilicon micromorph, cadmium selenide, aluminum antimonide, indium phosphide, aluminum arsenide, gallium phosphide, and gallium antimonide, gallium arsenide, gallium indium phosphide, germanium, inorganic nanocrystals and organic semiconductors.

The LSC of claim 1 may further include a wavelength selective mirror coupled to the substrate, the wavelength selective mirror being configured to reflect light at the peak emission wavelength. The wavelength selective mirror may be configured to transmit incident light in the visible band and the peak absorption wavelength. The LSC may include a first wavelength selective mirror disposed on a first surface of the substrate and a second wavelength selective mirror disposed on a second surface of the substrate, the first wavelength selective mirror being transparent in the visible band and at the peak absorption wavelength and reflective at the peak emission wavelength, the second wavelength selective mirror being transparent in the visible band and reflective at the peak emission wavelength and at the peak absorption wavelength.

A method of forming a visibly transparent luminescent solar concentrator (LSC) is also disclosed. The method includes providing a transparent substrate having at least one edge surface. A dye layer is formed and coupled to the substrate, the dye layer having a peak absorption wavelength outside the visible band, the dye layer being configured to re-emit light at a peak emission wavelength outside the visible band, at least a portion of the re-emitted light being waveguided to the edge surface of the substrate. A photovoltaic device is coupled to the edge surface of the transparent substrate, the photovoltaic device being configured to absorb light at the peak emission wavelength and generate electrical energy.

The peak emission wavelength may be selected to optimize internal reflections within the transparent substrate. The transparent substrate may have an index of refraction selected to optimize internal reflections within the transparent substrate. The dye layer may have a peak absorption wavelength in at least one of the ultraviolet (UV) and near-infrared (NIR) bands. The dye layer may have a peak absorption of up to 20% of light in the visible band. The dye layer may have a peak absorption of up to 50% of light in the visible band.

The dye layer may include at least one of a molecular dye, an organometallic complex, and a rare earth phosphor. The dye layer may include at least one component selected from the group of a phthalocyanine, a porphyrin, rhodamine, an organic laser dye, perylene and its derivatives, a cyanine, a coumarin, a dioxazine, a naphthalimide, a thiazine and a stilbene. The dye layer may include at least one of U3, SnPc and carbon nanotubes. The LSC may also include a second dye layer with a peak absorption in at least one of the ultraviolet (UV) and near-infrared (NIR) bands and up to 20% of light in the visible band. In another embodiment, the LSC may include a second dye layer with a peak absorption in at least one of the ultraviolet (UV) and near-infrared (NIR) bands and up to 50% of light in the visible band.

An index matching compound may be disposed between the edge of the substrate and the photovoltaic device. A wavelength selective mirror may be disposed on the substrate, the wavelength selective mirror being configured to reflect light at the peak emission wavelength. The wavelength selective mirror may be configured to transmit incident light in the visible band and the peak absorption wavelength. A first wavelength selective mirror may be disposed on a first surface of the substrate and a second wavelength selective mirror may be disposed on a second surface of the substrate, the first wavelength selective mirror being transparent in the visible band and at the peak absorption wavelength and reflective at the peak emission wavelength, the second wavelength selective mirror being transparent in the visible band and reflective at the peak emission wavelength and at the peak absorption wavelength.

The photovoltaic device may include at least one of cadmium telluride, cadmium indium gallium selenide, copper indium sulfide, amorphous silicon, monocrystalline silicon, multicrystalline silicon, amorphous silicon/polysilicon micromorph, cadmium selenide, aluminum antimonide, indium phosphide, aluminum arsenide, gallium phosphide, and gallium antimonide, gallium arsenide, gallium indium phosphide, germanium, inorganic nanocrystals and organic semiconductors.

A method of generating electricity is also disclosed. The method includes providing a luminescent solar concentrator (LSC) having a transparent substrate having at least one edge surface. A dye layer is coupled to the substrate, the dye layer having a peak absorption wavelength outside the visible band, the dye layer being configured to re-emit light at a peak emission wavelength outside the visible band, at least a portion of the re-emitted light being waveguided to the edge surface of the substrate; and a photovoltaic device coupled to the edge surface of the transparent substrate, the photovoltaic device being configured to absorb light at the peak emission wavelength and generate electrical energy. The LSC is exposed to light.

BRIEF DESCRIPTION OF THE FIGURES

FIG. 1a is a side sectional view of a transparent, near infra-red (NIR)/ultraviolet (UV) absorbing luminescent solar concentrator (LSC) with a dye layer distributed throughout the thickness of the substrate;

FIG. 1b is a side sectional view of LSC with a dye layer disposed on the top surface of the substrate;

DETAILED DESCRIPTION OF THE INVENTION

Figure 1C:
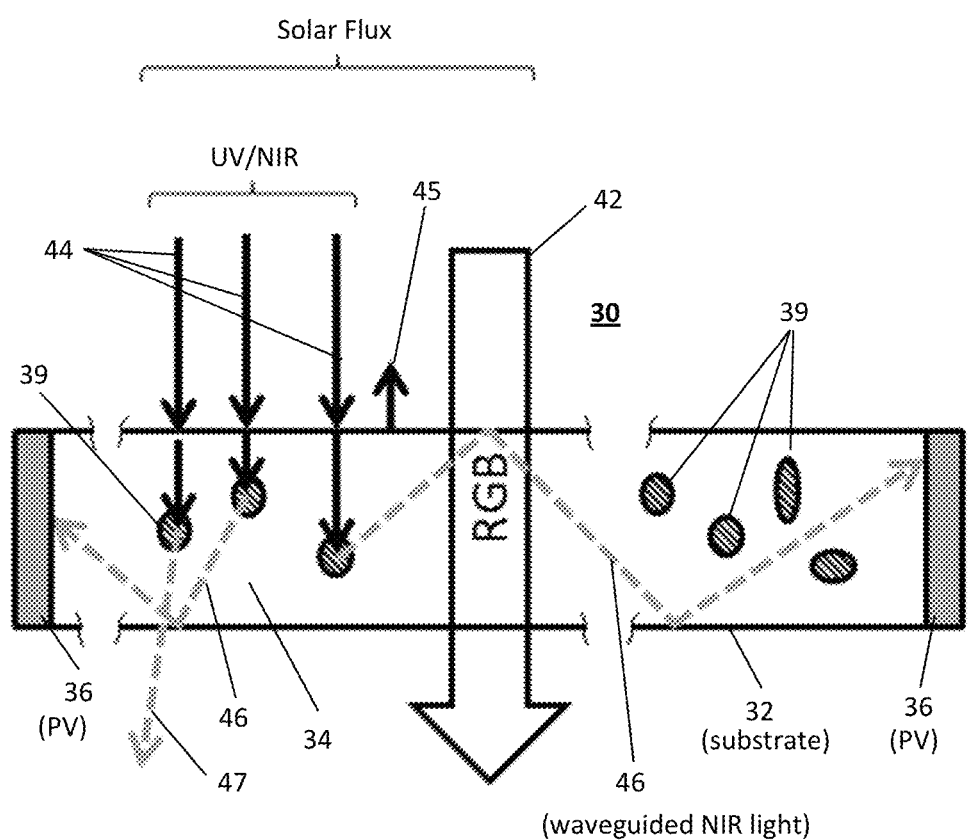
FIG. 1c is a highly magnified side sectional view of an LSC with a dye layer distributed throughout the thickness of the substrate.

Disclosed herein is a transparent luminescent solar cell configuration. The cell includes either neat or doped molecular luminescent layers with absorption and emission features only in the ultra-violet (UV) and near-infrared (NIR) solar spectrum (absorption and emission peaks outside the visible spectrum), disposed in/on a transparent matrix or substrate. These molecules remit solar radiation outside of the visible band e.g., at longer wavelengths into waveguided modes of the host substrate. This waveguided light is captured at the edge of the LSC and converted to electricity via any suitable solar cell, such as Si, GaAs, InGaAs, etc. Given high NIR photoluminescence quantum yields, limiting efficiencies for transparent solar architectures may be more rapidly and cheaply realized.

The term "transparent" as used herein encompasses average transmission of a straight through beam of 45% or more across the visible band. The term "near-infrared" (NIR) and "near-infrared band" as recited herein is defined as light having wavelengths in the range from the upper edge of the visible band (about 650 nm) to about 2-3 um. The term "ultraviolet" (UV) and "ultraviolet band" as recited herein is defined as light having wavelengths from the lower edge of the visible band (about 450 nm) and less. The term "visible light" and "visible band" as recited herein is defined as light having wavelengths to which the human eye has a significant response, from about 435 nm to about 670 nm.

FIG. 1a is side sectional view of a transparent luminescent solar concentrator (LSC) 10. The LSC 10 includes a transparent matrix or substrate 12. The substrate is generally transparent to visible light may be constructed from a variety of materials such as glass or a variety of plastics including thermoplastic polymers such as acrylics, polycarbonates and the like. The substrate 10 generally includes an upper and lower surface 11, 13. The substrate 10 also includes at least one side surface. Assuming the substrate has a generally rectangular geometry, e.g., as shown in FIG. 1d, the substrate 10 will include 4 side surfaces. In this example, only the left and right side surfaces 15, 17 are shown. The LSC 10 also includes a UV/NIR absorbing luminescent dye (dye) layer 14. It should be understood that dye layer 14 may include one or more individual layers formed of one or more dyes as shown generally by dashed line 19. In general the dye layer 14 is configured to absorb UV/NIR light at a peak absorption wavelength and re-emit light a peak emission wavelength.

The LSC also includes at least one photovoltaic device (PV) 16 configured to absorb the light emitted at the peak emission wavelength. Suitable PV devices may be selected from a variety of devices as disclosed above including Si PV devices (typically lower cost and lower efficiency) and GaAs and InGaAs PV devices (typically higher cost and higher efficiency). In general the photovoltaic device may include at least one of the following: cadmium telluride, cadmium indium gallium selenide, copper indium sulfide, amorphous silicon, monocrystalline silicon, multicrystalline silicon, amorphous silicon/polysilicon micromorph, cadmium selenide, aluminum antimonide, indium phosphide, aluminum arsenide, gallium phosphide, and gallium antimonide, gallium arsenide, gallium indium phosphide, germanium, inorganic nanocrystals and organic semiconductors.

The LSC 10 may also include an index matching layer 18 configured to reduce reflection losses associated with the interface between the substrate 12 and the PV 16. It should be understood that the dye layer 24 may be applied to one or more surfaces of the substrate or may be distributed throughout the thickness of the substrate. For example, FIG. 1b is a side sectional view of a LSC 20 with a dye layer 24 deposited on the upper surface 21 of the substrate 22. The LSC 20 also includes at least one PV device 26 configured to absorb the light emitted at the second wavelength as disclosed above. The LSC 20 may also include an index matching layer 28 configured to reduce reflection losses associated with the interface between the substrate 22 and the PV 16 as disclosed above.

Figure 1D:
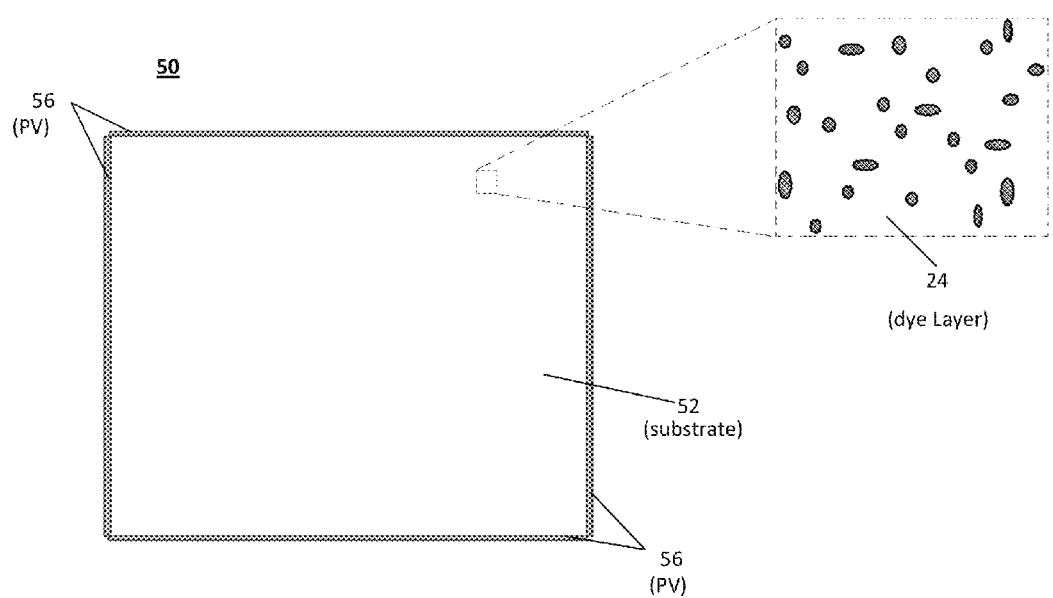
FIG. 1d is a top view of a rectangular LSC with PV devices disposed on all four edges of the substrate.

FIG. 1c is a highly magnified side sectional view of an LSC 30 with a dye layer 34 distributed throughout the thickness of the substrate 32. The LSC includes PV devices 36 disposed at the edges of the substrate as disclosed above. It should be understood that an index matching layer (not shown) may be used to reduce reflection losses associated with the interface between the substrate 32 and the PV devices 36 as disclosed above. The dye layer 34 comprises a plurality of individual dye molecules shown generally by reference number 39. The substrate 32 is generally transparent to visible light as shown by arrow 42. When exposed to sun light, full spectrum light enters the substrate as shown by arrows 44 and hits dye molecules 39. The dye molecules 39 generally have a peak absorption wavelength outside the visible band (UV/NIR). The dye molecules are configured to re-emit light at a peak emission wavelength that is also outside the visible band, e.g., in the NIR band. The peak emission wavelength is typically selected so that the emitted light is internally reflected (waveguided to the edges) of the substrate 32. It should be understood that selection of the peak emission wavelength will depend upon the optical properties of the substrate material. It should also be understood that a portion of the light striking the LSC 30 is reflected as shown by arrow 45. Similarly, a portion of the light emitted by the dye will not be internally reflected as shown by arrow 47.

FIG. 1d is a top view of a rectangular LSC 50 with a dye layer 34 deposited on the surface of the transparent substrate 52. The LSC 50 includes PV devices 56 disposed on all four edges of the substrate. As discussed above, an index matching layer (not shown) may be used to reduce reflection losses associated with the interface between the substrate 32 and the PV 36.

Figure 2A:
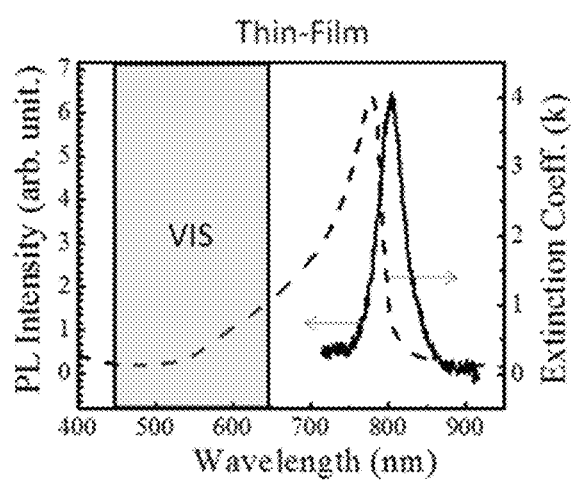
FIG. 2a is a graph showing the performance of a suitable U3 dye.
Figure 2A:
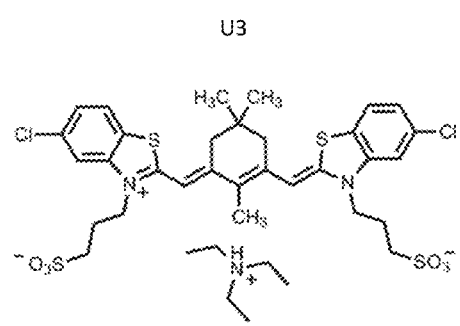
Figure 2B:
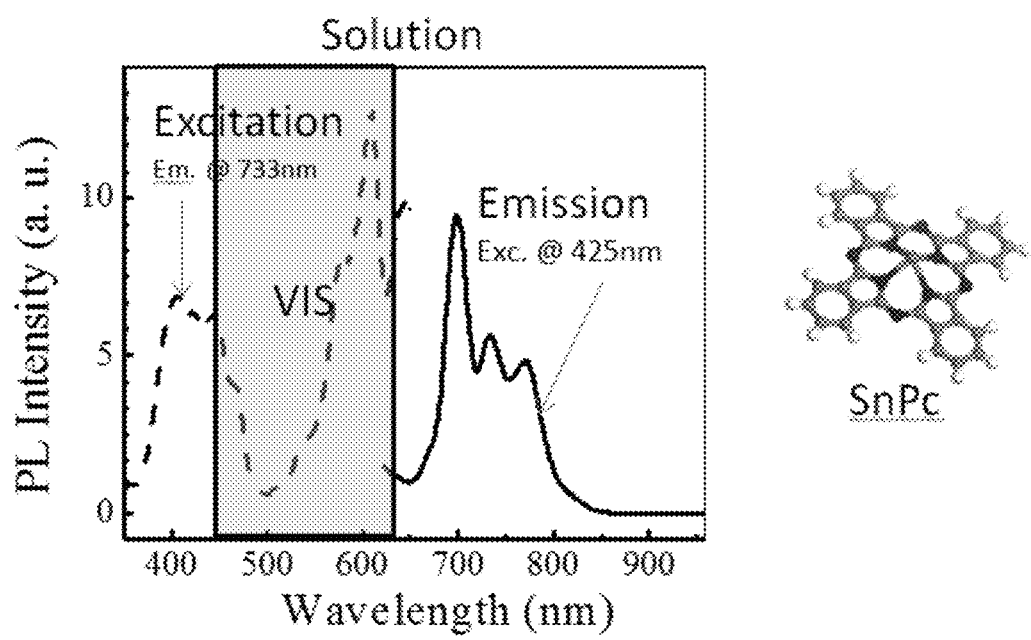
FIG. 2b is a graph showing the performance of a suitable SnPc dye.

It should also be understood that a portion of the light striking the LSC may be absorbed by the dye layer. Section of appropriate dye materials is an important consideration. Several dye materials may be used with the LSCs disclosed herein. For example, FIG. 2a is a graph showing the performance of a suitable U3 dye with peak absorption and emission wavelengths in the NIR band. U3 has a peak absorption wavelength (dashed line) at about 775 nm and a peak emission wavelength at about 800 nm (solid line). FIG. 2b is a graph showing the performance of a suitable SnPc dye. SnPc has an absorption peak in the UV band, an absorption peak in the visible band and NIR bands (dashed line). SnPc also has a peak emission in the NIR band as shown.

Figure 2C:
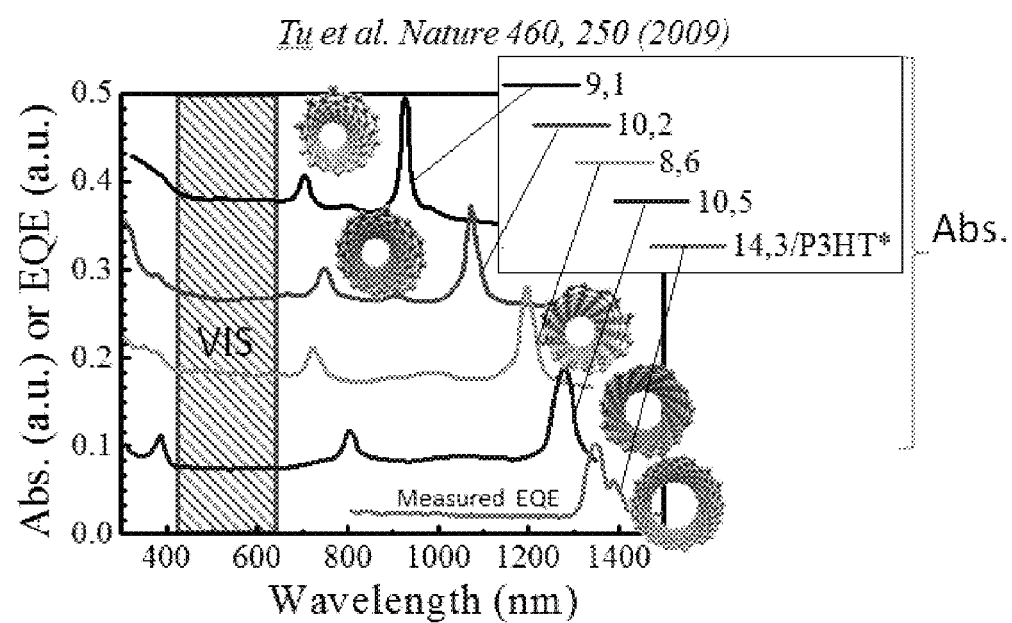
FIG. 2c is a graph showing the performance of several types of suitable carbon nanotubes that may be used in a dye.
Figure 2D:
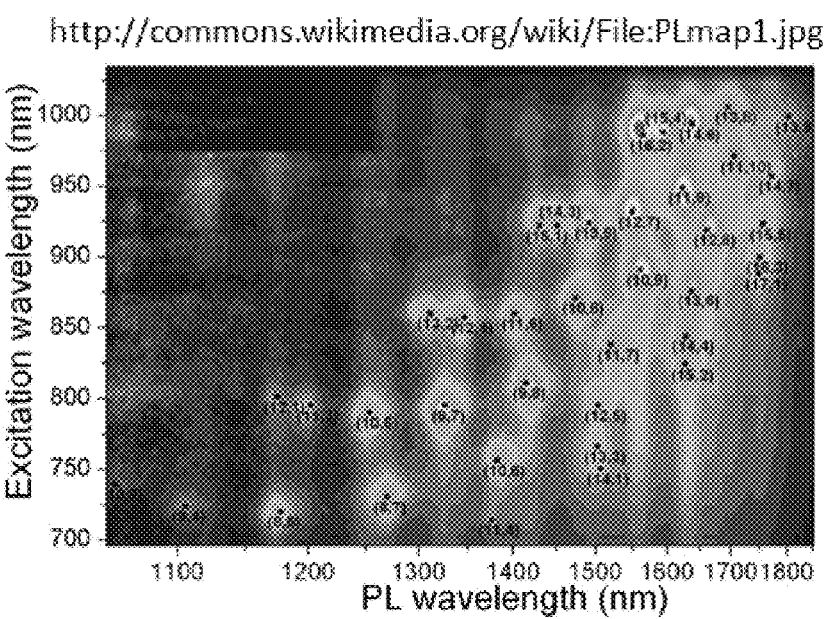
FIG. 2d is a photoluminescence map from suitable single-wall carbon nanotubes.

FIG. 2c is a graph showing the peak absorption wavelength of several types of suitable carbon nanotubes that may be used in a dye. FIG. 2d is a photoluminescence map from suitable single-wall carbon nanotubes. All of these carbon nanotubes have peak absorption wavelengths outside of the visible band. The lower curve shows the quantum efficiency of an actual photovoltaic device using 14,3 carbon nanotubes. FIG. 2d is a graph showing the peak emission wavelengths of several types of carbon nanotubes. All of these carbon nanotubes have emission peaks outside of the visible band.

The luminescent solar concentrators disclosed herein may be made using a variety of different dyes such as, for example the illustrative dyes described above. Other suitable dyes include but are not limited to: rare earth phosphors, organometallic complexes, porphyrins, perylene and its derivatives, organic laser dyes, FL-612 from Luminophor JSC, substituted pyrans (such as dicyanomethylene, coumarins (such as Coumarin 30), rhodamines (such as Rhodamine B), oxazine, Exciton LDS series dyes, Nile Blue, Nile Red, DODCI, Epolight 5548, BASF Lumogen dyes (for instance: 083, 170, 240, 285, 305, 570, 650, 765, 788, and 850), other substituted dyes of this type, other oligorylenes, and dyes such as DTTC1, Steryl 6, Steryl 7, prradines, indocyanine green, styryls (Lambdachrome series), dioxazines, naphthalimides, thiazines, stilbenes, IR132, IR144, IR140, Dayglo Sky Blue (D-286) Columbia Blue (D-298), and organometallic complexes of rare earth metals (such as europium, neodymium, and uranium).

Figure 3:
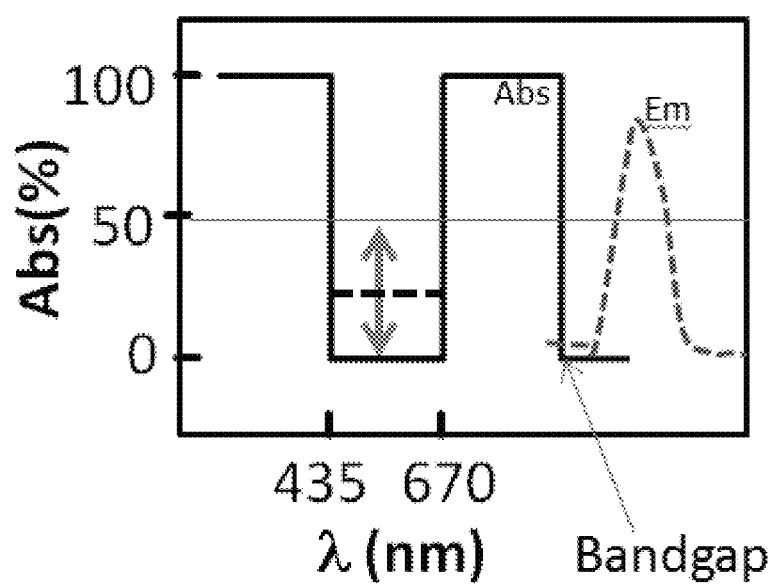
FIG. 3 shows a graph of idealized absorption and emission spectra.

It should be understood that several of the disclosed dyes may be combined in one or more dye layers to optimize the bandwidth of the absorption band. FIG. 3 shows a graph idealized absorption and emission spectrums. In general, the absorption peak(s) may be located anywhere outside the visible band. The different dye layers may be combined to optimize the spectral coverage of the LSC. Dye layers may be selected such that bandgap between absorption and emission peaks have minimal overlap. In general, it is desirable to provide some separation between the dye absorption peaks and the emission peaks so that emitted light is not re-absorbed. This typically reduces re-absorption losses. The dyes may be applied via a variety of methods. For example, a dye layer may be applied by a thin film deposition process to the surface of the transparent substrate. A dye layer may also be combined with the substrate materials and distributed throughout the thickness of the substrate. Using the disclosed dyes, an LSC may be constructed with up to 20% light absorption in the visible band. Less preferably, an LSC may be constructed with up to 50% light absorption in the visible band.

As discussed above, the substrate is generally transparent to visible light may be constructed from a variety of materials including but not limited to polymethylmethacrylate (PMMA), glass, lead-doped glass, lead-doped plastics, aluminum oxide, polycarbonate, polyamide, polyester, polysiloxan, polyester resins, epoxy resins, ethyl cellulose, polyethylene terephthalate, polyethylenimine, polypropylene, poly vinyl chloride, soda lime glass, borosilicate glasses, acrylic glass, aluminum oxynitride, fused silica, halidechalcogenide glasses, titania-doped glass, titania-doped plastics, zirconia-dopes glass, zirconia-dopes plastics alkaline metal oxide-doped glass, barium-doped plastics, and zinc oxide-doped glass, and zinc oxide-dopes plastics.

The substrate may be formed of high refractive index material. The term "high refractive index" refers to a material having a refractive index of at least 1.7. By increasing the refractive index of the substrate, the light trapping efficiency of the solar concentrator may be increased. Illustrative high refractive index materials suitable for use in solar concentrators disclosed herein include, but are not limited to, high index glasses such as lead-doped glass, aluminum oxide, halidechalcogenide glasses, titania-doped glass, zirconia-doped glass, alkaline metal oxide-doped glass, barium oxide-doped glass, zinc oxide-doped glass, and other materials such as, for example, lead-doped plastics, barium-doped plastics, alkaline metal oxide-doped plastics, titania-doped plastics, zirconia-doped plastics, and zinc oxide-doped plastics."

The substrate may have an index of refraction that is chosen to optimize internal reflections within the transparent substrate. Selection of index of refraction generally involves balancing front side reflection losses (at 90°) with increased internal reflection efficiency. For example, a substrate with an index of refraction of 1.5 will generally have 4% front side reflection (at 90°) and 75% internal reflection. A substrate having an index of refraction of 2.2 will have 14% reflection at 90° and 89% internal reflection.

The LSC may further include one or more wavelength selective mirrors coupled to the substrate. The wavelength selective mirrors may be generally configured to reflect light at the peak emission wavelength to improve the efficiency of the LSC.

Figure 4A:
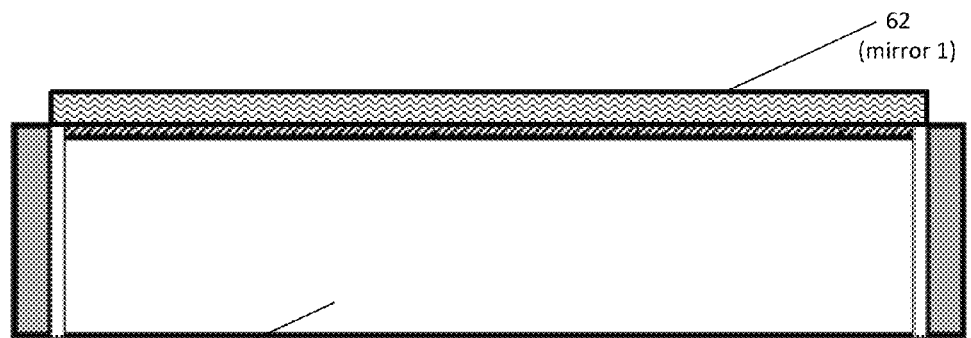
FIG. 4a is a block diagram showing an LSC with a wavelength selective mirror coupled to the top surface of the substrate.
Figures 5A, 5B:
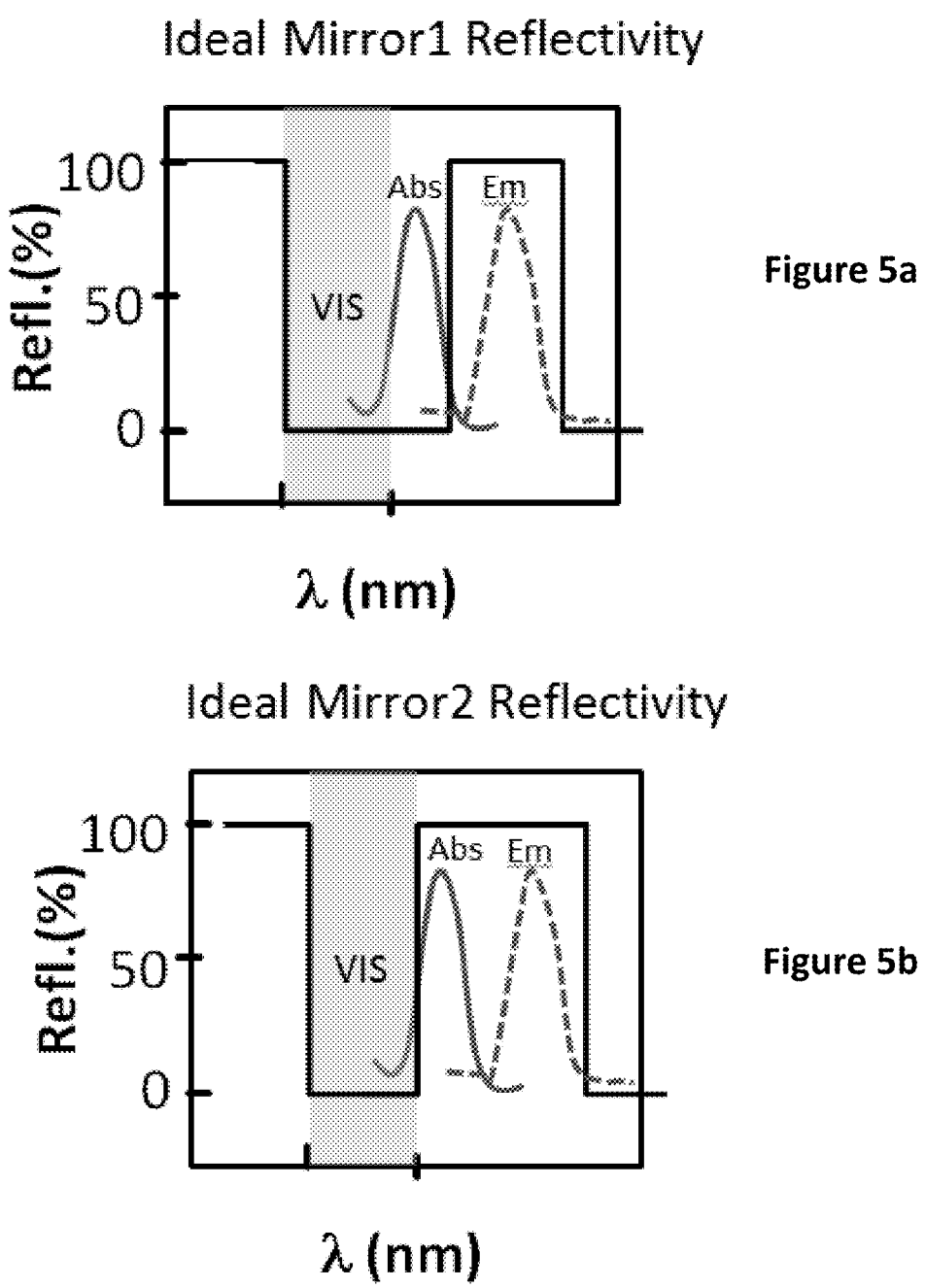
FIG. 5a is a graph showing the ideal mirror reflectivity for a first reflective mirror.
FIG. 5b is a graph showing the ideal mirror reflectivity for a second reflective mirror.

FIG. 4a is a block diagram showing an LSC 60 with a single wavelength selective mirror 62 coupled to the top surface of the substrate. The wavelength selective mirror 62 may be configured to transmit incident light in the visible band and at the peak absorption wavelength. The wavelength selective mirror 62 may be configured to reflect light at the peak emission wavelength. FIG. 5a is a graph showing the ideal mirror reflectivity for such a wavelength selective mirror.

Figure 4B:
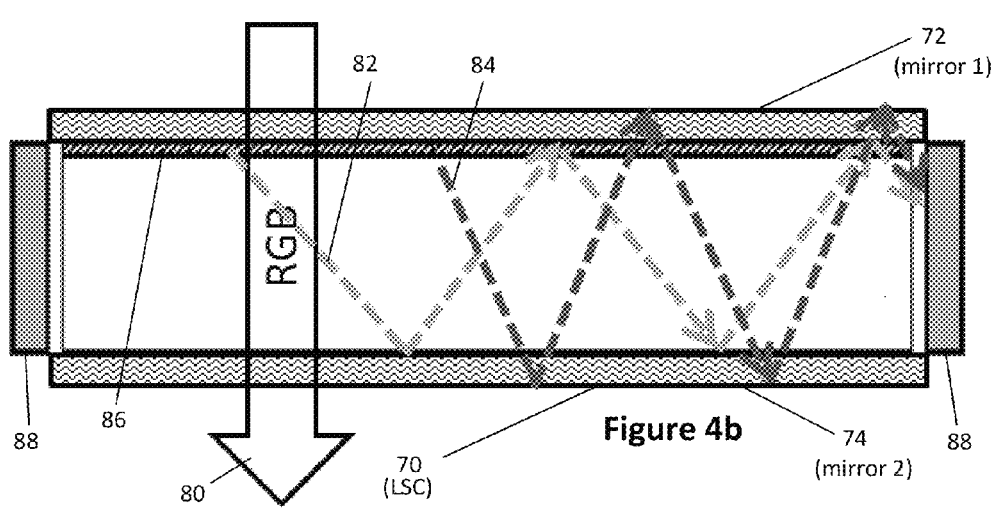
FIG. 4b is a block diagram showing an LSC with wavelength selective mirrors coupled to the top and bottom surfaces of the substrate.

FIG. 4b is a block diagram showing an LSC 70 with wavelength selective mirrors 72, 74 coupled to the top and bottom surfaces of the substrate. In this example, both wavelength selective mirrors 72, 74 are configured to transmit incident light in the visible band and at the peak absorption wavelength and reflect light at the peak emission wavelength as shown in FIG. 5a. In operation, as light enters the LSC (see arrow 80), the dye layer emits light at the peak emission wavelength. A portion of the light at the peak emission wavelength is waveguided by the substrate as discussed above (see arrow 82). A portion of the light at the peak emission wavelength is not waveguided due to typical losses. Some of this light is reflected by the wavelength selective mirror(s) and may be directed to the PVs 88 as shown by arrow 84.

Figure 4C:
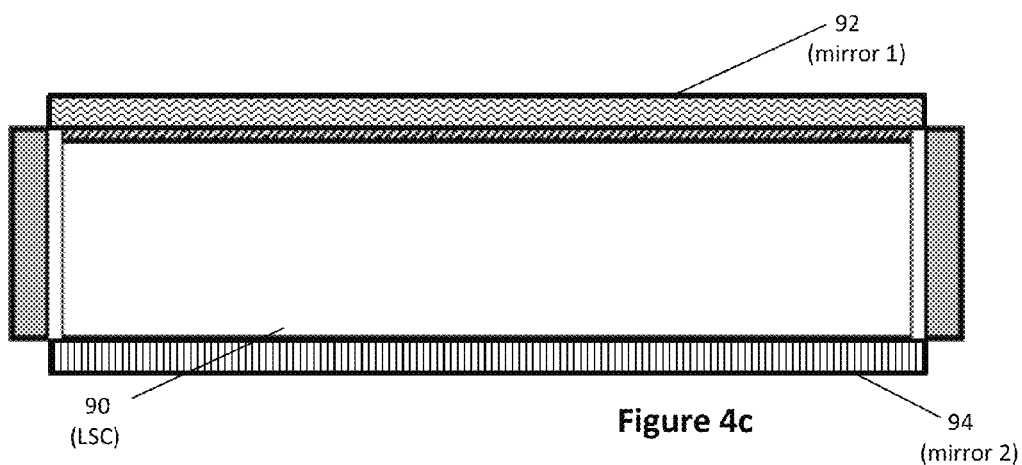
FIG. 4c is a block diagram showing an LSC with wavelength selective mirrors coupled to the top and bottom surfaces of the substrate.

FIG. 4c is a block diagram showing an LSC 90 with wavelength selective mirrors 92, 94 coupled to the top and bottom surfaces of the substrate. The first wavelength selective mirror 92 is configured to transmit incident light in the visible band and the peak absorption wavelength and reflect light at the peak emission wavelength as shown in FIG. 5a. The second wavelength selective mirror 94 is configured to transmit incident light in the visible band and reflect light at the peak absorption wavelength and the peak emission wavelength. FIG. 5b is a graph showing the ideal mirror reflectivity for such a second wavelength selective mirror.

Figure 6:
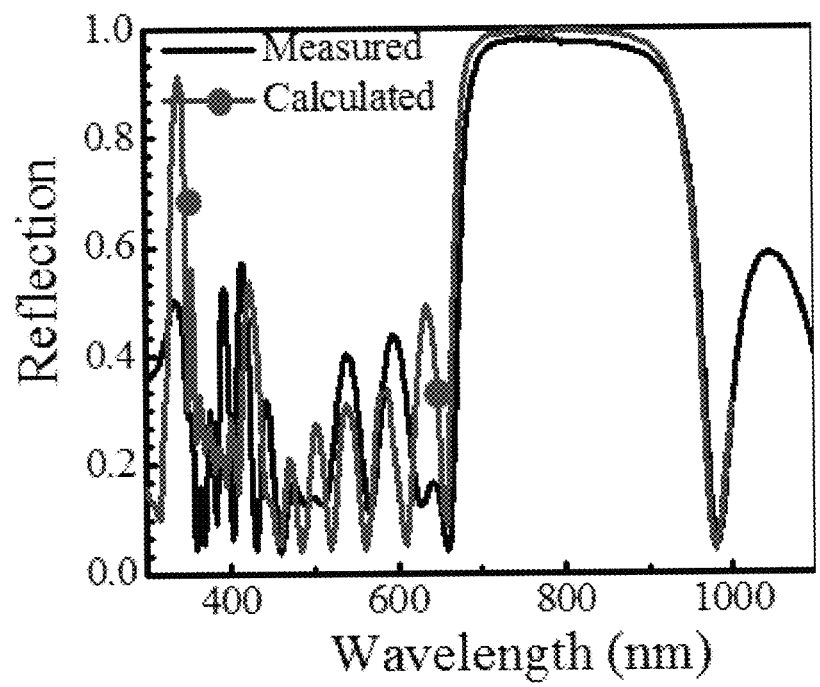
FIG. 6 is a graph showing the performance characteristics of an example NIR mirror.

Suitable wavelength selective mirrors may be fabricated using a variety of materials and processes. For example, a wavelength selective mirror may be fabricated by sputtering or otherwise depositing one or more dielectric layers onto the substrate such as alternating layers of $SiO_2$ and $TiO_2$. FIG. 6 is a graph showing the performance characteristics of an example NIR mirror suitable that is reflective in the 650 nm-980 nm range.

It should be understood that many variations are possible based on the disclosure herein. Although features and elements are described above in particular combinations, each feature or element can be used alone without the other features and elements or in various combinations with or without other features and elements.

What is claimed is:

1. A visibly transparent luminescent solar concentrator (LSC) having an average visible band absorption of up to 20%, the LSC comprising:
   a visibly transparent substrate having at least one edge surface, wherein the visibly transparent substrate has an average visible band transmission of 45% or more;
   visibly transparent photoluminescent organic dye molecules, corresponding to luminophore components, coupled to the visibly transparent substrate, wherein the visibly transparent photoluminescent organic dye molecules:
      exhibit a peak absorption wavelength outside a visible band,
      exhibit a maximum visible band absorption of up to 20%, and
      absorb light at wavelengths outside the visible band and generate photoluminescent light at a peak emission wavelength outside the visible band,
   wherein the visibly transparent substrate is configured to waveguide at least a portion of the photoluminescent light to the at least one edge surface of the visibly transparent substrate; and
   a photovoltaic device coupled to the at least one edge surface of the visibly transparent substrate, wherein the photovoltaic device is configured to absorb light at the peak emission wavelength outside the visible band and generate electrical energy.

2. The LSC of claim 1, wherein the peak emission wavelength outside the visible band is selected to optimize internal reflections of the photoluminescent light within the visibly transparent substrate.

3. The LSC of claim 1, wherein the visibly transparent substrate has an index of refraction selected to optimize internal reflections of the photoluminescent light within the visibly transparent substrate.

4. The LSC of claim 1, wherein the peak absorption wavelength outside the visible band is in at least one of an ultraviolet (UV) band and a near-infrared (NIR) band.

5. The LSC of claim 1, wherein the peak emission wavelength outside the visible band is in a near-infrared (NIR) band.

6. The LSC of claim 1, wherein the visibly transparent photoluminescent organic molecules comprise a molecular dye or an organometallic complex.

7. The LSC of claim 1, wherein the visibly transparent photoluminescent organic molecules comprise at least one component selected from the group consisting of a phthalocyanine, a porphyrin, a rhodamine, an organic laser dye, a perylene, a cyanine, a coumarin, a dioxazine, a naphthalimide, a thiazine, and a stilbene.

8. The LSC of claim 1, wherein the visibly transparent photoluminescent organic molecules comprise at least one of U3, SnPc, and single-wall carbon nanotubes.

9. The LSC of claim 1, further comprising second visibly transparent photoluminescent organic molecules coupled to the visibly transparent substrate, wherein the second visibly transparent photoluminescent organic molecules exhibit a second maximum visible band absorption of up to 20%.

10. The LSC of claim 1, further comprising second visibly transparent photoluminescent organic molecules coupled to the visibly transparent substrate, wherein the second visibly transparent photoluminescent organic molecules exhibit a second maximum visible band absorption of up to 50%.

11. The LSC of claim 1, further comprising an index matching layer disposed between the at least one edge surface of the visibly transparent substrate and the photovoltaic device.

12. The LSC of claim 1 wherein the photovoltaic device comprises at least one of cadmium telluride, cadmium indium gallium selenide, copper indium sulfide, amorphous silicon, monocrystalline silicon, multicrystalline silicon, amorphous silicon/polysilicon micromorph, cadmium selenide, aluminum antimonide, indium phosphide, aluminum arsenide, gallium phosphide, and gallium antimonide, gallium arsenide, gallium indium phosphide, germanium, an inorganic nanocrystal and an organic semiconductor.

13. The LSC of claim 1, further comprising a wavelength selective mirror coupled to the visibly transparent substrate, wherein the wavelength selective mirror reflects light at the peak emission wavelength outside the visible band.

14. The LSC of claim 13, wherein the wavelength selective mirror transmits incident light having wavelengths in the visible band and at the peak absorption wavelength outside the visible band.

15. The LSC of claim 1, further comprising a first wavelength selective mirror disposed on a first surface of the visibly transparent substrate and a second wavelength selective mirror disposed on a second surface of the visibly transparent substrate, wherein the first wavelength selective mirror is transparent in the visible band and at the peak absorption wavelength outside the visible band and reflective at the peak emission wavelength outside the visible band, and wherein the second wavelength selective mirror is transparent in the visible band and reflective at both the peak emission wavelength outside the visible band and at the peak absorption wavelength outside the visible band.

16. A method of forming a visibly transparent luminescent solar concentrator (LSC) having an average visible band absorption of up to 20%, the method comprising:
providing a visibly transparent substrate having at least one edge surface, wherein the visibly transparent substrate has an average visible band transmission of 45% or more;
coupling visibly transparent photoluminescent organic molecules, corresponding to luminophore components, to the visibly transparent substrate, wherein the visibly transparent photoluminescent organic molecules:
exhibit a peak absorption wavelength outside a visible band,
exhibit a maximum visible band absorption of up to 20%, and
absorb light at wavelengths outside the visible band and generate photoluminescent light at a peak emission wavelength outside the visible band, and
wherein the visibly transparent substrate is configured to waveguide at least a portion of the photoluminescent light to the at least one edge surface of the visibly transparent substrate, the visibly transparent LSC having up to 20% light absorption across the visible band; and
coupling a photovoltaic device to the at least one edge surface of the visibly transparent substrate, wherein the photovoltaic device is configured to absorb light at the peak emission wavelength outside the visible band and generate electrical energy.

17. The method of claim 16, wherein the peak emission wavelength outside the visible band is selected to optimize internal reflections within the visibly transparent substrate.

18. The method of claim 16, wherein the visibly transparent substrate has an index of refraction selected to optimize internal reflections within the visibly transparent substrate.

19. The method of claim 16, wherein the peak absorption wavelength outside the visible band is in at least one of an ultraviolet (UV) band and a near-infrared (NIR) band.

20. The method of claim 16, wherein the peak emission wavelength outside the visible band is in a near-infrared (NIR) band.

21. The method of claim 16, wherein the visibly transparent photoluminescent organic molecules exhibit a band gap between an emission band including the peak emission wavelength outside the visible band and an absorption band including the peak absorption wavelength outside the visible band.

22. The method of claim 16, wherein the visibly transparent photoluminescent organic molecules comprise of a molecular dye or an organometallic complex.

23. The method of claim 16, wherein the visibly transparent photoluminescent organic molecules comprise at least one component selected from the group consisting of a phthalocyanine, a porphyrin, a rhodamine, an organic laser dye, a perylene, a cyanine, a coumarin, a dioxazine, a naphthalimide, a thiazine, and a stilbene.

24. The method of claim 16, wherein the visibly transparent photoluminescent organic molecules comprise at least one of U3, SnPc, and single-wall carbon nanotubes.

25. The method of claim 16, further comprising coupling second visibly transparent photoluminescent organic molecules to the visibly transparent substrate, wherein the second visibly transparent photoluminescent organic molecules exhibit a second maximum visible band absorption of up to 20%.

26. The method of claim 16, further comprising coupling second visibly transparent photoluminescent organic molecules to the visibly transparent substrate, wherein the second visibly transparent photoluminescent organic molecules exhibit a second maximum visible band absorption of up to 50%.

27. The method of claim 16, further comprising disposing an index matching layer between the at least one edge surface of the visibly transparent substrate and the photovoltaic device.

28. The method of claim 16, further comprising disposing a wavelength selective mirror on the visibly transparent substrate, wherein the wavelength selective mirror reflects light at the peak emission wavelength outside the visible band.

29. The method of claim 28, wherein the wavelength selective mirror transmits incident light having wavelengths in the visible band and at the peak absorption wavelength outside the visible band.

30. The method of claim 16, further comprising disposing a first wavelength selective mirror on a first surface of the visibly transparent substrate and disposing a second wavelength selective mirror on a second surface of the visibly transparent substrate, wherein the first wavelength selective mirror is transparent in the visible band and at the peak absorption wavelength outside the visible band and reflective at the peak emission wavelength, and wherein the second wavelength selective mirror is transparent in the visible band and reflective at both the peak emission wavelength outside the visible band and at the peak absorption wavelength outside the visible band.

31. The method of claim 16 wherein the photovoltaic device comprises at least one of cadmium telluride, cadmium indium gallium selenide, copper indium sulfide, amorphous silicon, monocrystalline silicon, multicrystalline silicon, amorphous silicon/polysilicon micromorph, cadmium selenide, aluminum antimonide, indium phosphide, aluminum arsenide, gallium phosphide, and gallium antimonide, gallium arsenide, gallium indium phosphide, germanium, an inorganic nanocrystal and an organic semiconductor.

32. A method of generating electricity, the method comprising:
providing a visibly transparent luminescent solar concentrator (LSC) having an average visible band absorption of up to 20%, wherein the LSC includes:
a visibly transparent substrate having at least one edge surface, wherein the visibly transparent substrate has an average visible band transmission of 45% or more;
visibly transparent photoluminescent organic molecules, corresponding to luminophore components, coupled to the visibly transparent substrate, wherein the visibly transparent photoluminescent organic molecules:
exhibit a peak absorption wavelength outside a visible band,
exhibit a maximum visible band absorption of up to 20%, and
absorb light at wavelengths outside the visible band and generate photoluminescent light at a peak emission wavelength outside the visible band,
wherein the visibly transparent substrate is configured to waveguide at least a portion of the photoluminescent light to the at least one edge surface of the visibly transparent substrate; and
a photovoltaic device coupled to the at least one edge surface of the visibly transparent substrate, wherein the photovoltaic device is configured to absorb light at the peak emission wavelength outside the visible band and generate electrical energy; and
exposing the LSC to incident light having wavelengths outside the visible band, wherein at least a portion of the incident light is absorbed by the visibly transparent photoluminescent organic molecules, wherein the visibly transparent photoluminescent organic molecules generate photoluminescent light having wavelengths outside the visible band, wherein at least a portion of the photoluminescent light having wavelengths outside the visible band is waveguided within the visibly transparent substrate to the photovoltaic device, and wherein the photovoltaic device absorbs at least a portion of the waveguided photoluminescent light having wavelengths outside the visible band to generate electricity.

33. The LSC of claim 1, wherein the substrate includes an upper surface and a lower surface, and wherein the visibly transparent photoluminescent organic molecules are included in a layer coupled to the upper surface, a layer coupled to the lower surface, or layers coupled to both the upper surface and the lower surface.

34. The LSC of claim 1, wherein the visibly transparent photoluminescent organic molecules are distributed throughout a thickness of the substrate.

* * * * *

UNITED STATES PATENT AND TRADEMARK OFFICE
CERTIFICATE OF CORRECTION

PATENT NO. : 9,985,158 B2
APPLICATION NO. : 13/495379
DATED : May 29, 2018
INVENTOR(S) : Lunt et al.

Page 1 of 1

It is certified that error appears in the above-identified patent and that said Letters Patent is hereby corrected as shown below:

In the Specification

In Column 1, Line 3, after title "Visibly Transparent, Luminescent Solar Concentrator" insert heading & paragraph:
--GOVERNMENT SUPPORT
This invention was made with government support under DE-SC0001088 awarded by the U.S. Department of Energy. The government has certain rights in the invention.--

Signed and Sealed this
Eleventh Day of November, 2025

John A. Squires
*Director of the United States Patent and Trademark Office*